(12) United States Patent
Lawson et al.

(10) Patent No.: US 8,347,199 B2
(45) Date of Patent: Jan. 1, 2013

(54) ENHANCED ERROR DETECTION IN MULTILINK SERDES CHANNELS

(75) Inventors: Matthew Todd Lawson, Grass Valley, CA (US); David S. Walker, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 949 days.

(21) Appl. No.: 12/357,022

(22) Filed: Jan. 21, 2009

(65) Prior Publication Data

US 2010/0185926 A1 Jul. 22, 2010

(51) Int. Cl.
*G06F 11/10* (2006.01)

(52) U.S. Cl. ........................................ 714/807

(58) Field of Classification Search ............ 714/807
See application file for complete search history.

(56) References Cited

U.S. PATENT DOCUMENTS

| | | | | |
|---|---|---|---|---|
| 4,486,739 A | 12/1984 | Franaszek et al. | | 340/347 |
| 6,650,638 B1 | 11/2003 | Walker et al. | | 370/389 |
| 6,718,491 B1 | 4/2004 | Walker et al. | | 714/701 |
| 7,069,407 B1 * | 6/2006 | Vasudevan et al. | | 711/169 |
| 7,443,922 B1 * | 10/2008 | Venkata et al. | | 375/295 |
| 7,593,380 B1 | 9/2009 | Ferguson et al. | | 370/342 |
| 2005/0058290 A1 * | 3/2005 | Kryzak et al. | | 380/268 |
| 2006/0200708 A1 * | 9/2006 | Gentieu et al. | | 714/704 |
| 2007/0201471 A1 * | 8/2007 | Sharma et al. | | 370/392 |
| 2008/0294801 A1 * | 11/2008 | Matsuda | | 710/5 |
| 2009/0010362 A1 * | 1/2009 | Thaler | | 375/340 |
| 2009/0135256 A1 * | 5/2009 | Komori | | 348/207.1 |
| 2010/0149412 A1 * | 6/2010 | Yamashita | | 348/443 |
| 2011/0222587 A1 * | 9/2011 | Chen | | 375/132 |

OTHER PUBLICATIONS

Med Belhadj, "Coding Techniques for High-Speed Serial Interconnect", Lightwave web page downloaded Jan. 27, 2009 from http://lw.pennnet.com/articles/article_display.cfm?article_id=281518, pp. 1-4.

"Common Electrical I/O—Protocol (CEI-P) Implementation Agreement," OIF Optical Internetworking Forum, Mar. 2008, pp. 1-63.

* cited by examiner

*Primary Examiner* — Scott Baderman
*Assistant Examiner* — Neil Miles
(74) *Attorney, Agent, or Firm* — Campbell Stephenson LLP

(57) ABSTRACT

A method for receiving packet data at a communication channel and transmitting the packet data over serial links of the communication channel. The packet data is sliced into n-bit data portions which are concatenated with a header prior to transmitting an n-bit portion across one of the serial links of the communication channel. The header includes a CRC to provide improved error detection.

16 Claims, 16 Drawing Sheets

| Bits | Serial Links | | | | | | | |
|---|---|---|---|---|---|---|---|---|
| | 0 | 1 | 2 | 3 | 4 | 5 | 6 | 7 |
| 0 | 1 | 0 | - | 0 | 1 | 1 | - | - |
| 1 | CRC | CRC | CRC | CRC | CRC | CRC | CRC | CRC |
| 9:2 | First slice of packet 1 ||||||||
| 17:10 | Second slice of packet 1 ||||||||
| 25:18 | Third slice of packet 1 ||||||||

| Bits | Serial Links | | | | | | | |
|---|---|---|---|---|---|---|---|---|
| | 0 | 1 | 2 | 3 | 4 | 5 | 6 | 7 |
| 0 | 1 | 0 | - | 0 | 0 | 1 | - | - |
| 1 | CRC | CRC | CRC | CRC | CRC | CRC | CRC | CRC |
| 9:2 | Penultimate slice of packet 1 ||||||||
| 17:10 | Final slice of packet 1 ||||||||
| 25:18 | First slice of packet 2 ||||||||

| Bits | Serial Links | | | | | | | |
|---|---|---|---|---|---|---|---|---|
| | 0 | 1 | 2 | 3 | 4 | 5 | 6 | 7 |
| 0 | DCS | Seq[0] | Seq[1] | Seq[2] | Seq[3] | Seq[4] | Seq[5] | Seq[6] |
| | | CCS | PS | PB[0] | PB[1] | PB[2] | Q[0] | Q[1] |
| | | | Seq[1] | Seq[2] | Seq[3] | Seq[4] | Seq[5] | Seq[6] |
| 1 | CRC | CRC | CRC | CRC | CRC | CRC | CRC | CRC |
| 9:2 | CC/Data | CC/Data | CC/Data | CC/Data | CC/Data | CC/Data | CC/Data | CC/Data |
| 17:10 | CC/Data | CC/Data | CC/Data | CC/Data | CC/Data | CC/Data | CC/Data | CC/Data |
| 25:18 | CC/Data | CC/Data | CC/Data | CC/Data | CC/Data | CC/Data | CC/Data | CC/Data |

} Frame

*Fig. 6B*

| Case | PB | Transfer | Transfer | Transfer |
|---|---|---|---|---|
| I | 3'b000 | $D_{n-2}$ | $D_{n-1}$ | $D_n$ |
| II | 3'b001 | $D_{n-1}$ | $D_n$ | $D_0$ |
| III | 3'b010 | $D_n$ | $D_0$ | $D_1$ |
| IV | 3'b011 | $D_0$ | $D_1$ | $D_2$ |
| V | 3'b100 | $D_{n-1}$ | $D_n$ | STUF |
| VI | 3'b101 | $D_n$ | STUF | STUF |
| VII | 3'b110 | $D_n$ | $D_0$ | STUF |
| Reserved | 3'b111 | Reserved | | |

ENHANCED ERROR DETECTION IN MULTILINK SERDES CHANNELS

FIELD OF THE INVENTION

The present disclosure refers generally to channel communication between devices and, more particularly, to apparatus and methods for efficient channel control for communication between devices.

BACKGROUND OF THE INVENTION

Communication channels are employed in many types of communication systems. Communication channels transmit multi-bit data between, for example, a line card and a switching fabric of a switch or a router.

BRIEF DESCRIPTION OF THE DRAWINGS

The present invention may be better understood, and its numerous objects, features and advantages made apparent to those skilled in the art by referencing the accompanying drawings.

FIG. 4B illustrates an example format for a frame that holds the first three byte slices of a packet.

FIG. 4C illustrates an example format for a frame that holds the last two byte slices of a first packet and the first byte slice of a second packet.

FIG. 6B illustrates a table that identifies different bit values of a frame according to one example.

FIG. 6C illustrates a table of different bit values and their meanings for packet boundary (PB) bits of the frame according to one example.

Figure 1:
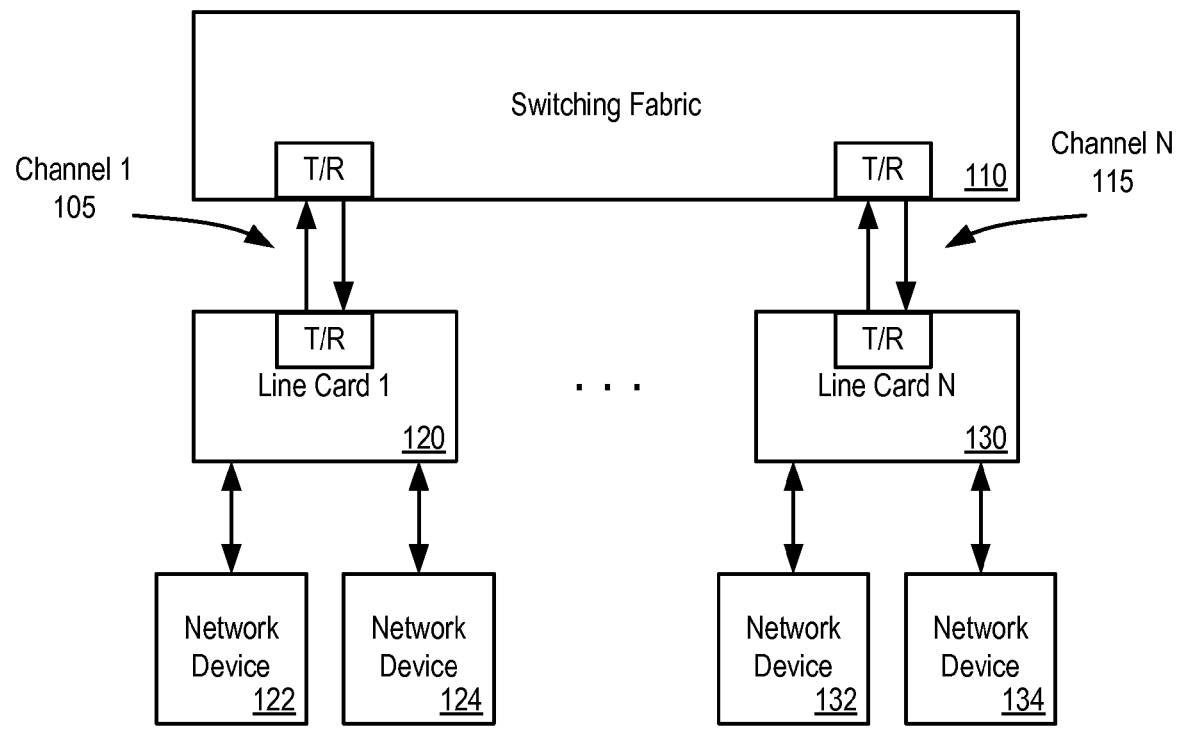
FIG. 1 illustrates relevant components of an example communication system.

While the invention is susceptible to various modifications and alternative forms, specific embodiments are provided as examples in the drawings and detailed description. It should be understood that the drawings and detailed description are not intended to limit the invention to the particular form disclosed. Instead, the intention is to cover all modifications, equivalents and alternatives falling within the spirit and scope of the invention as defined by the appended claims.

DETAILED DESCRIPTION

Overview

A line card having packet data to transmit to a switching fabric breaks the packet into a plurality of frames. Each frame comprises a portion of the packet. For each frame, a cyclic redundancy check (CRC) is calculated for the frame and embedded in the frame. The frame is then transmitted over a multi-link serial interface to the switching fabric.

In another embodiment, a switch receives several serial portions of data. The switch concatenates the portions to form a frame. The switch generates a CRC for the frame and compares the generated CRC with a CRC embedded in the frame to determine whether the frame was transmitted without error.

Description of Example Embodiments

FIG. 1 illustrates a block diagram showing relevant components of an example communication system 100. Communication system 100 includes a switching fabric 110 and multiple line cards 120-130. It should be noted that a transmitter/receiver (T/R) is located at either end of the illustrated communication channels of the communication system 100. The communication system 100 connects various devices 122, 124, 132, and 134 to each other. Devices 122, 124, 132, and 134 can, in general, include a variety of different devices including computer systems, output devices, storage devices (e.g., disk arrays), or other communication systems such as routers, switches, etc.

It will be noted that the variable identifier "N" is used in FIG. 1 (and in other parts of this application) to more simply designate the final element (e.g., line card N 130) of a series of related or similar elements. The repeated use of such variable identifiers is not meant to imply a correlation between the sizes of such series of elements, although such correlation may exist. The use of such variable identifiers does not require that each series of elements has the same number of elements as another series delimited by the same variable identifier. Rather, in each instance of use, the variable identified by "N" may hold the same or a different value than other instances of the same variable identifier. In a similar context, the variable "M" appears in other parts of this application and represents the final element in a series of related or similar elements and may hold the same or a different value than the variable "N."

Figure 2:
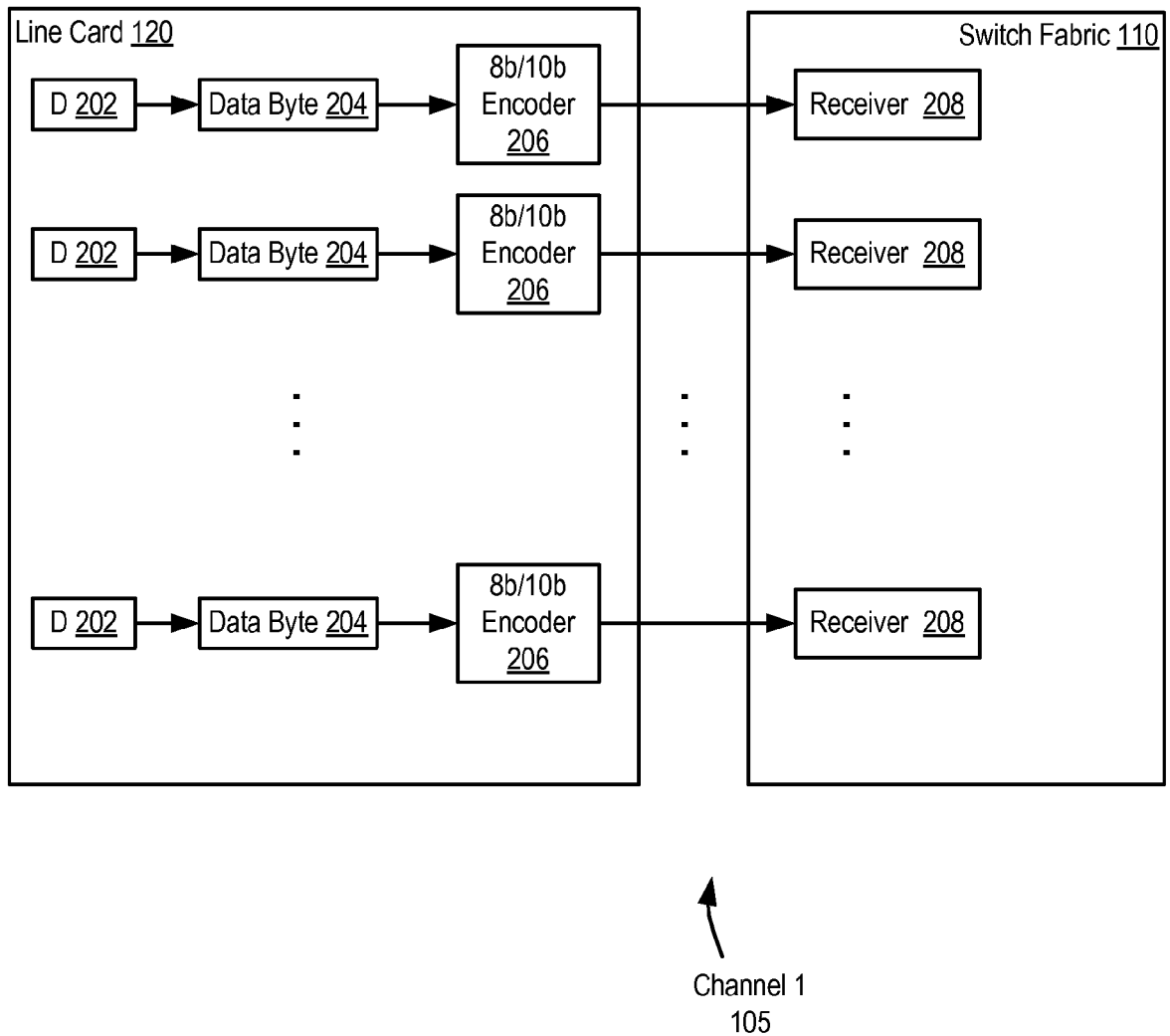
FIG. 2 illustrates relevant components of example communication channels.

Communication system 100 can employ a variety of different communication protocols enabling data communication between devices. For example, multi-link communication channels 105-115 may be formed between line cards 120-130 and switching fabric 110, respectively. FIG. 2 illustrates relevant components of an example multi-link communication channel 105 coupled between line card 120 and switching fabric 110 of FIG. 1. Multi-link communication channels often use a protocol known as 8b/10b for transferring data from the line card 120 to the switch fabric 110, or vice-versa. To illustrate relevant operating aspects, assume the multi-link communication channel 105 includes eight serial links. If a 72 byte packet were to be transferred across the eight link channel 105, the 72 bytes would be divided into nine slices, each containing eight bytes. Each of the nine slices are transmitted across channel 105 one after the other. The eight bytes of each slice are transmitted at roughly the same time across the eight links, respectively, of channel 105.

Before being transmitted, each byte in a slice is encoded using the 8b/10b encoding protocol mentioned above. Moreover, before any slice of a packet is transmitted across the channel 105, a one byte packet delimiter 202 is transmitted simultaneously across each of the eight links. Delimiters can be used to designate the boundaries between packets that are consecutively transmitted between a line card and a switching fabric. The delimiters may contain information about the packets they separate. For example, delimiters may identify the priority of a packet that follows. Unfortunately, the transmission of the delimiters between packets reduces the number of packets that can be transmitted across channel 105 during a given period of time, assuming a constant bandwidth of channel 105.

8b/10b encoders 206 are provided to avoid run length and/or DC imbalance problems that can arise when too many bits of the same value (e.g., logical one or logical zero) are being consecutively transmitted across a link. Each 8b/10b encoder 206 receives an eight bit delimiter or data byte 204 of a slice that is to be transmitted across a serial link of the communication channel 105. The 8b/10b encoder encodes the eight bit delimiter or data byte to produce a ten bit value before transferring the ten bit value across its respective link of the communication channel 105. This ten bit value is formatted to preclude run length and DC imbalance problems that may arise during transmission across the link. A receiver 208 at the switch fabric 110 converts the encoded ten bit value back into the original eight bit data byte or delimiter, and the channel 105 remains viable during packet transmission. However, because the 8b/10b encoder 206 adds an additional two bits for each eight bit data byte 204 or delimiter that is transferred, over the course of transmission across the channel 105, a 72 byte packet requires an additional 18 bytes to be transmitted across the channel 105 for the packet payload, thus reducing the number of packets that can be transmitted across channel 105 during a given period of time.

A method is described below for receiving transport layer packet data and transmitting the packet data across at least two serial links of the communication channel. The packet data is formatted into slices of packet data bytes which are concatenated to transmit the packet data bytes across the communication channel. When packet data bytes are on a packet boundary, as described further herein, a virtual delimiter may be set to indicate such packet boundary. The specific formatting scheme for transmission of data between a line card and switch is known as a physical layer encoding protocol because the scheme controls how data must be formatted in order to be transmitted correctly across a physical medium. Physical layer encoding relates to data manipulation at the physical layer, or immediately prior to transmission over a physical medium. Physical layer defines the transmission of bits at the fundamental layer upon which all higher level network functions are implemented.

The method can also include providing one or more physical layer error checking mechanisms for the data to be transmitted across the serial links. One error checking method can include generating a cyclic redundancy check (CRC) for a physical layer frame. A sender can transmit the CRC along with the data. When the data and CRC are received by a receiver, the receiver can generate a new CRC for the data. The receiver can compare the two CRCs. If the CRCs do not match, the data is said to be transmitted with error. If the CRCs do match, the data is said to have been transmitted from the sender to the receiver without error.

The method can also include scrambling the data prior to transmitting the data. In one embodiment, the scrambling includes exclusive-ORing the data with a scrambled value.

When the data is received by the receiver, the receiver can descramble the data by exclusive-ORing the received data with the same scrambled value. The descrambled data should equal the data before the data was scrambled.

Scrambling the data prior to transmission can help avoid potential run length and/or DC imbalance problems. Since, according to one embodiment, the data is exclusive OR-ed with random numbers, the transmitted (scrambled) data appears random. Since random data should, over a period of time, have the same number of bits with the value 0 as bits with the value 1, DC imbalance problems can be avoided.

Figure 3:
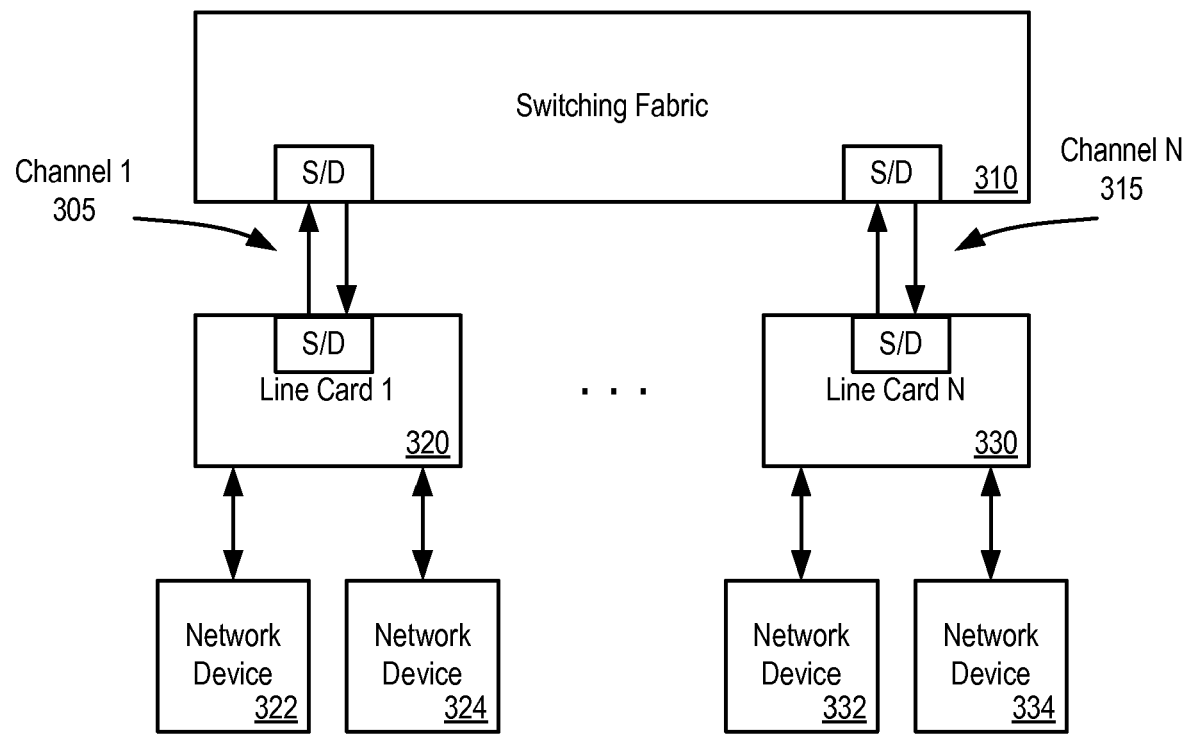
FIG. 3 illustrates relevant components of an example communication system.

FIG. 3 illustrates an example communication system 300 according to one embodiment. Similar to FIG. 1, the communication system 300 includes a switching fabric 310 coupled to multiple line cards 320-330 via respective communication channels. The present disclosure focuses on communication between a line card and a switching fabric, it being understood that the nothing in the present disclosure is intended to be limiting of the various embodiments disclosed herein. For example, the one embodiment could be employed to increase the channel utilization efficiency between a disk controller and a hard disk in a disk array or between a switch and a disk array in a storage area network.

Various devices 322, 324, 332, and 334 communicate with each other through switching fabric 310 and line cards 320-330. Devices 322, 324, 332, and 334 can, in general, include a variety of different devices including computer systems, output devices, storage devices, etc. Communication channels 305-315 may be formed, respectively, between line cards 320-330 and switching fabric 310. Communication system 300 employs a communication protocol that enables data communication between devices 322, 324, 332, and 334 according to principles of one embodiment.

In the most general sense, line cards receive packets for subsequent transmission to other line cards via switching fabric 310. These packets are known as transport layer packets. Transport layer packets typically include header and/or trailer information used, for example, for routing, synchronization, and error control. The header and/or trailer information used for error control can include cyclic redundancy check values (CRCs) or checksums, for example. The header and/or trailer information surrounds packet payload data contained in the packet.

Prior to transmission from a line card to a switch, and vice versa, transport layer packet data is typically encoded according to what is known as a physical layer encoding protocol. The physical layer encoding protocol specifies how a device (e.g. a linecard) transmits data to a physical medium, such as serial communications lines. The encoding of data produces encoded frames for transmission. Data is typically serialized and deserialized by serializer/deserializer modules (known as serdes modules, or simply serdes (S/D)) located at either end of the links of illustrated communication channels 305-315. For example, serdes 420 can convert data to a serial data stream (serialize the data) prior to transmission from the line card to the switching fabric 310. The data can also be scrambled prior to transmission. When the data reaches the switching fabric (in serial form,) deserializer 440 can convert the data back to parallel form (deserialize the data). The data can also be descrambled after being received at the switching fabric.

Figure 5:
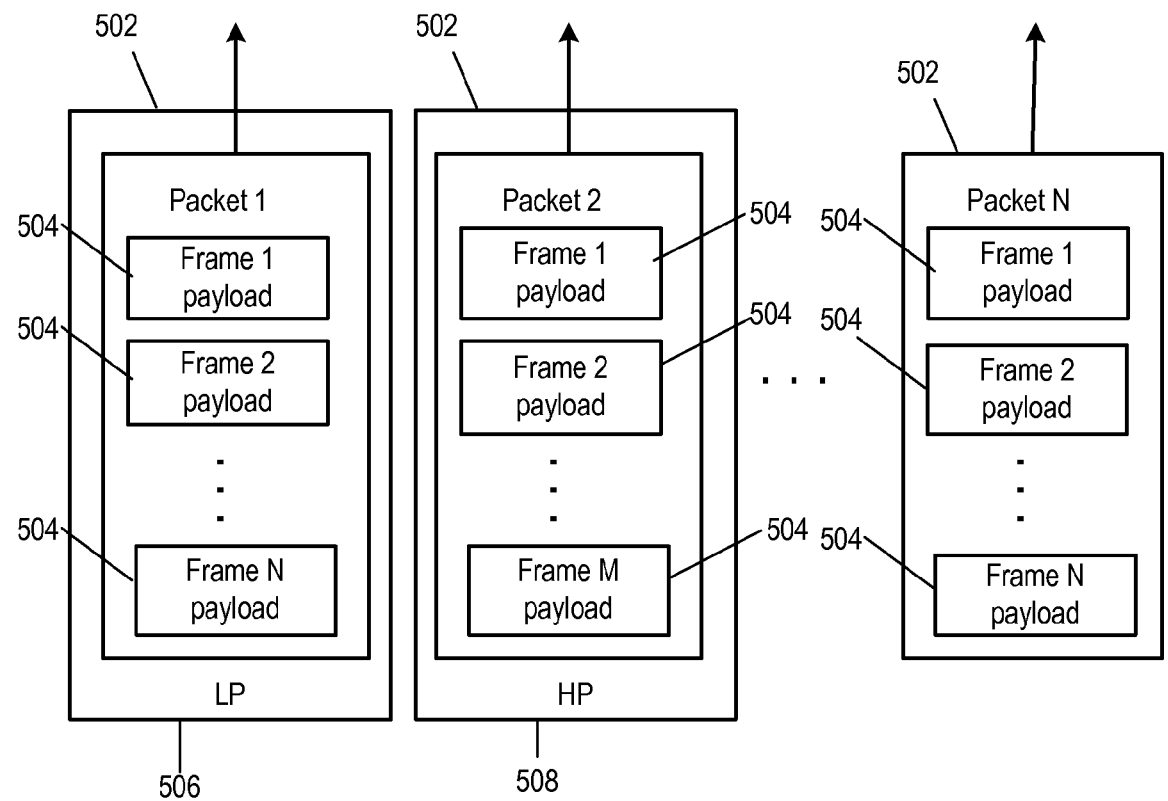
FIG. 5 illustrates example packets.

As described in greater detail in relation to FIGS. 5 and 6, packets can be divided and placed into frames. The frames are formatted in accordance with a physical layer encoding protocol, resulting in encoded frames. Some of the frames include a virtual delimiter and/or CRC, as well as a frame payload that is a portion of a data packet. The virtual delimiter of a frame can be used to identify the boundaries between packets transmitted across a communication channel such as communication channel 305, while the CRC can be used to detect potential transmission errors in serial links of the communication channel.

Figure 4A:
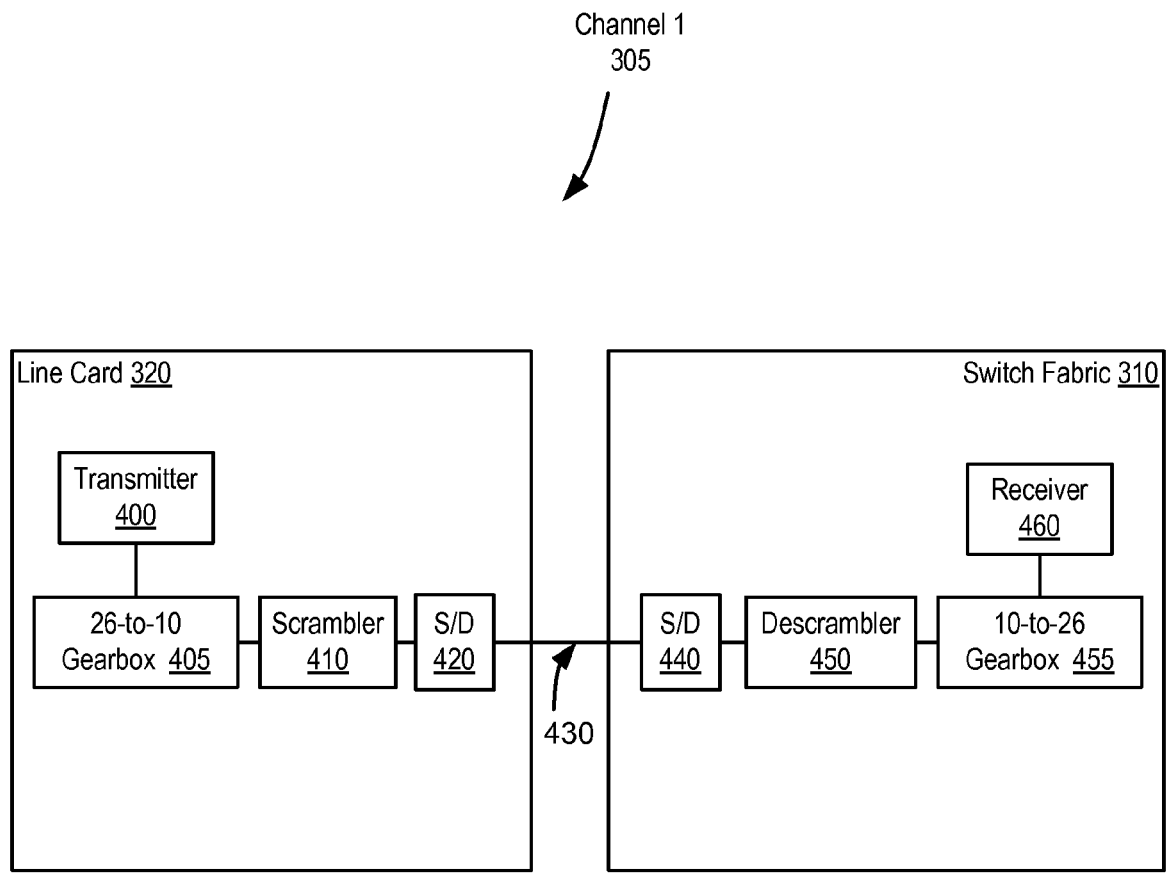
FIG. 4A illustrates relevant components of an example communication channel.

FIG. 4A is a block diagram showing a more detailed view of one of the serial links of communication channel 305 of FIG. 3. The communication channel 305 includes link 430, which is made up of N serial links. For the purposes of explanation only, channel 305 will be described as including eight serial links it being understood that the present invention can be employed with channels having fewer or more than eight serial links. Each serial link of link 430 couples transmitter 400, 26-to-10 gearbox 405, scrambler 410, and serdes 420 at the line card 320 and serdes 440, descrambler 450, 10-to-26 gearbox 455, and receiver 460 at the switch fabric 310.

As noted, packets of various sizes are sequentially received from network devices at the line card 320 of FIG. 4A. Each received packet is divided within the line card 320 into slices, each slice containing eight bytes. Frames are constructed from the eight byte slices of packet data. Each frame contains three slices of packet data and a header, although a frame in an alternative embodiment may contain more three slices of packet data. As will be more fully described below, each frame can contain slices of one packet or slices of two consecutively received packets. Each frame header can include a CRC byte, more fully described below. Some frames can include a virtual delimiter byte, while other frames can contain an error check code byte. The virtual delimiter byte can identify inter or intra frame boundaries between packets received by line card 320 as will be more fully described below. Virtual delimiters can also identify priority of the packet data contained in the frame, also more fully described below. For the purposes of explanation only, it will be presumed that each frame header contains a CRC byte. Moreover, it will be presumed for the purposes of explanation only that each frame header contains a virtual delimiter byte or an error check code byte.

After a frame is constructed, the frame is transmitted across the eight links of channel 305. More particularly, the first eight bits of the frame (which include the virtual delimiter or error check code bits) are transmitted simultaneously across the eight serial links, respectively, to the eight receivers, respectively, on the switch fabric side. Thereafter, the eight bits of the CRC byte are transmitted simultaneously across the eight serial links, respectively, to the eight receivers, respectively, on the switch fabric side. Of course, the respective eight bit transmissions may occur in a different order than described herein. The eight bytes of the first slice in the frame payload are serially transmitted across the eight serial links, respectively, to the eight receivers, respectively. The eight bytes of the second slice in the frame payload are then serially transmitted across the eight serial links, respectively, to the eight receivers, respectively. Finally, the eight bytes of the third slice in the frame payload are serially transmitted across the eight serial links, respectively, to the eight receivers, respectively. Accordingly, each serial link transmits one bit of the virtual delimiter or error check code byte, one bit of the CRC byte, and one byte of each of the three frame payload slices. The combination of one bit of the virtual delimiter or error check code byte, one bit of the CRC byte, and respective bytes of three frame payload slices transmitted over a serial link will be referred to herein as a frame segment. Thus, the eight links of channel 305 transmit eight frame segments, respectively, for each frame transmitted between the line card 320 and switching fabric 310. Once the frame segments are received, the switch fabric side of the serial communications channel includes means to extract and use the frame payload bytes to reconstruct the packet(s) as originally received at the line cards. Such means can include various software modules and hardware components, devices, or circuitry.

As noted, bytes of a packet are transmitted across each of the serial links of the communication channel 305 in a 26 bit stream of serial data called a "segment." Each segment includes three bytes of a packet and two bits of frame header that is to be transferred over the respective link, i.e., three bytes of segment payload and two bits of segment header rather than transferring 30 bits for three bytes of segment payload as with 8b/10b encoders. Thus, when eight segments are transferred across respective serial links of the communication channel 305, 24 bytes of payload may be transferred with two bytes (16 bits) of header.

The eight segments are referred to herein as a frame when collectively transferred across the communication channel 305. The 26 bytes of a frame could be referred to as a two byte frame header and 24 byte frame payload, the 24 byte frame payload representing bytes of one or two packets. If a frame contains the first three slices of a packet or the last three slices of a packet, the frame header should contain a virtual delimiter that indicates that the frame contains the first three or the last three slices of the packet. Further, if the frame contains some other packet boundary arrangement of slices such as the last two slices of a first packet and the first slice of a second packet, the frame header should contain a virtual delimiter that indicates that the first two slices of the frame are from one packet while the last slice is from another packet. For example, FIG. 4B illustrates an example encoded 26 byte frame B having a frame header with a virtual delimiter within the frame header that is set to indicate a frame payload holding the first three slices of a packet while FIG. 4C shows a similar encoded frame C having a virtual delimiter set to indicate a frame payload holding the last two slices of a first packet and the first slice of a second packet. In the illustrated examples of FIGS. 4B and 4C, bits 3-5 of the virtual delimiters are set to 011 and 001, respectively. In FIG. 4B, bits 3-5 of the virtual delimiter indicate that the payload of frame B contains the first three slices of a packet, while in FIG. 4C, bits 3-5 of the virtual delimiter are set to indicate that the payload of frame C contains the last two slices of a packet and the first slice of a second packet.

As illustrated, the virtual delimiter of a frame header may indicate the packet boundaries within the frame payload by the setting one or more bits in the frame header. The delimiter bits are typically included in the first byte of the frame, so to include a virtual delimiter indicating a packet boundary within the frame, the system can set the first bit of one or more segments. This combination of respective first bits of segment headers is referred to as a virtual delimiter of certain frames because the combination of these bits of the frame header serves the purpose of the packet delimiter described above (and otherwise), but is located within a frame. The second header byte of a frame can represent a CRC. The second bit of each segment represents one bit of the CRC byte. Each CRC bit, when combined with the CRC bits from the other segments, can be used to detect transmission errors in the serial communications channel. These CRC bits of the eight link frame form the eight bit CRC byte.

FIG. 5 is a block diagram illustrating packets 502 that may be sequentially input to line card 320 of FIG. 4A for subsequent transfer to, for example, line card 330. Each packet 502 can be divided into a number of frame payloads, e.g., frame payloads 504, that may be sliced for inclusion into segments as described in relation to FIG. 6A. A virtual packet delimiter can be located within one or more of the frames. Advantageously, a virtual packet delimiter within a frame spans links of the communication channel 305 rather than being duplicated and sent on each serial link of the channel 305. Thus, overhead for each packet 502 is reduced and a higher data transmission rate is realized for the available bandwidth on the channel 305 when packets are transmitted via channel frames.

Figure 6A:
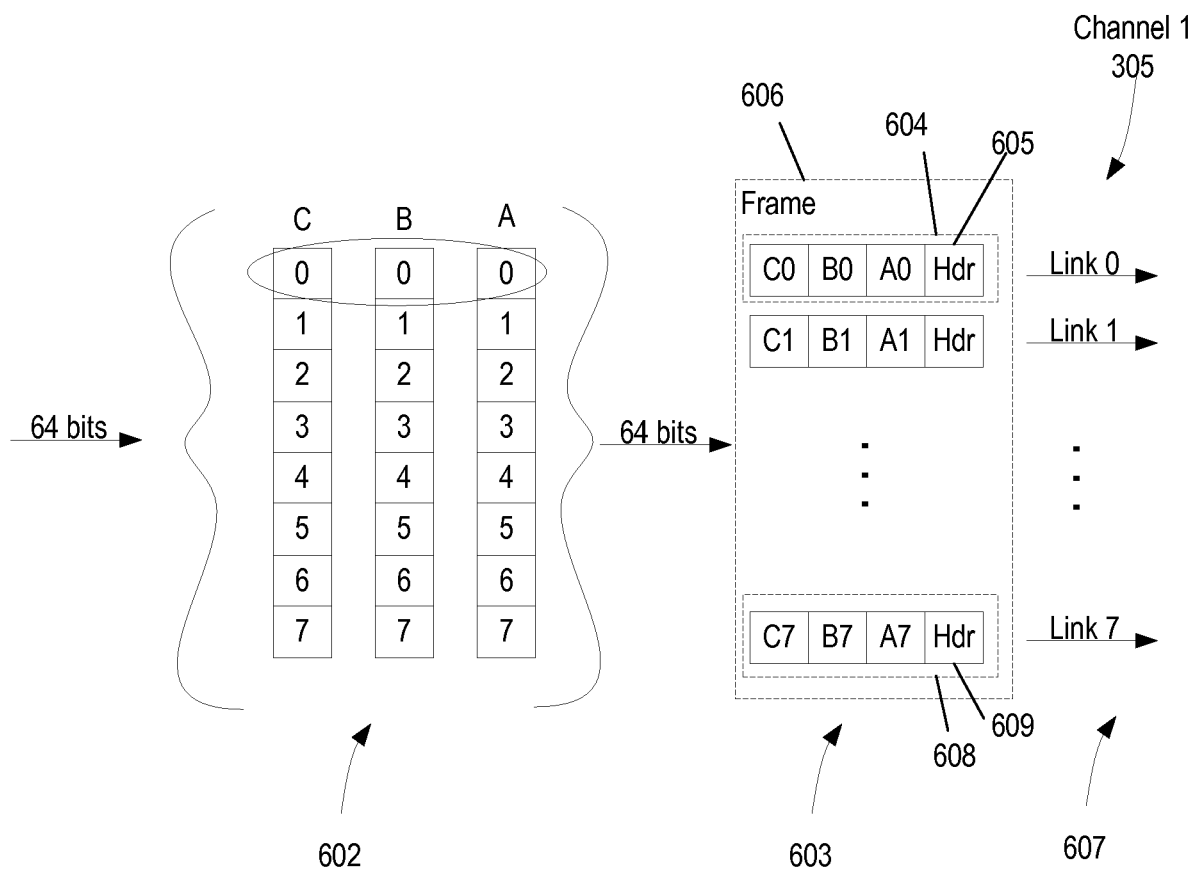
FIG. 6A illustrates stages of data as the data traverses a communication channel according to one example.

FIG. 6A illustrates different data stages as data bits of a packet are received and transmitted across the communication channel 305 within a frame. In a first stage 602, data bits of the packet are separated into bytes of data as illustrated in slices A, B, and C. For example, if the first 64 bits of the packet were received in parallel at point A, the 64 bits could be split into eight bytes of frame payload data, i.e., A0, A1, A2, etc. to A7, represented by slice A. At point B, the next set of 64 bits of the packet could be received and split into another eight bytes of frame payload data, i.e., B0, B1, etc., represented by slice B. Likewise, at point C, the next set of 64 bits of the packet could be received and split into another eight bytes of frame payload data, i.e., C0, C1, etc., represented by slice C. Thus, by appropriately splitting each set of 64 bits of packet data that is received, the three slices, A, B, and C, of the first stage 602 represent 24 bytes of frame payload data.

In a next stage 603, a byte from each of the three slices A, B, and C is concatenated to form a segment payload as illustrated by segment 604. Segment 604 includes byte 0 from each of slices A, B, and C as well as a segment header (Hdr) 605 that includes two bits of a two byte frame header. The two byte frame header accompanies all bytes of the three slices of frame payload data. The combined segments for each of the links of the communication channel 305 are illustrated in FIG. 6A as frame 606.

In a next stage 607, the 24 byte groupings of packet data are transmitted across the links of the communication channel 305 as payload of respective segments of a frame. Each segment of frame 606 includes three bytes of segment payload for a total of 24 bytes of payload in the frame 606. Each segment of frame 606 also includes two bits of segment header information for a total of 16 bits or two bytes of header information for the frame 606. In other words, the two bytes of header information spans the eight serial links of the communication channel 305 such that segment 608 may include a different two bit segment header 609 than the segment header 605 of segment 604.

FIG. 6B shows frame variables of a frame in one embodiment of the eight link communication channel 305. Each of columns 0-7 represents a 26 bit frame segment that is to be transmitted across a respective link of the communication channel 305. The first two bits (0 and 1) of each segment represent the segment header of each link while the remaining bits (2 through 25) represent the segment payload of each link. The DCS bit (i.e., the first bit of the first segment header in the first segment) indicates whether the payload of the frame represented by segments 0-7 is data (i.e. packet data) or control information. Different meanings for the first bit of the remaining segment headers depend on the bit state of the DCS bit.

For example, if the DCS bit is set to logical 0, the frame payload is solely packet data, and the first bit of the remaining segment headers contain error check code bits (indicated by Seq[0]-Seq[6]) that can be used for error checking of the frame payload data once received at the receivers of the switch fabric. The error check code bits comprise a sequence number. The transmitter assigns each frame that is to be transmitted with an error check code byte a sequence number. The sequence numbers follow a predictable pattern. For example, the sequence numbers may be the values output by a simple counter. In such an embodiment, the sequence numbers would follow the pattern 1, 2, 3, etc. The transmitter can embed a sequence number as an error check code. The receivers check to see if the sequence number follows the expected pattern. If the sequence number does not represent the expected next value in the sequence, an error indication is generated by the receiver. Such an error could result from a misalignment of the segments with respect to each other, for example, as a result of skew.

On the other hand, if the DCS bit is set to logical 1, and the first bit of the second segment header is set to logical 0, the frame contains a virtual delimiter, and the first bit of the remaining segment headers may be used to indicate the bits of the virtual packet delimiter. With the DCS bit set to logical 1 and the first bit of the second segment header set to logical 1, the frame contains pure control data for internal use within, for example, the switching fabric. Further, with the DCS bit set to logical 1 and the first bit of the second segment header set to logical 1, the first bits of the remaining segment headers contain error check code bits (indicated by Seq[1]-Seq[6]) that comprise a sequence number for the pure control data.

The virtual packet delimiter of the frame table illustrated in FIG. 6B may be considered to be a collection of respective 0 bits (first bit) from each of links 2-7. As illustrated, the 0 bit of segment 2 is a packet separator (PS) bit that indicates whether the frame payload includes a packet boundary or whether packet preemption codes are currently selected. The respective 0 bits of segments 3-5 represent packet boundary (PB) bits that may be set to identify which slice of bits in the frame represents the end or beginning of a packet. FIG. 6C is a table showing seven different cases for settings of the three PB bits of the virtual delimiter. For example, case IV represents the example of FIG. 4B in which the PB bits are set to 011 and the slices of the frame are the first three slices of a packet. The transfer of each of the first three eight bit slices of a packet is represented by $D_0$, $D_1$, and $D_2$, respectively. Case II represents the example of FIG. 4C in which the PB bits are set to 001 and the slices are the last two slices of a first packet, $D_{n-1}$ and $D_n$, and the first slice of a second packet, $D_0$. Of course, other arrangements for the PB bits are contemplated as illustrated by the remaining example cases of the table of FIG. 6C.

The virtual delimiter of FIG. 6B also includes a Q bit in each of segments 6 and 7. The Q bits may be set to represent the priority of the current frame. For example, a setting of 00 could be used to indicate a low priority payload while a setting of 01 could be used to indicate a higher priority payload. In the event that the DCS bit is set to logical 0, and the first bit of the second segment header is set to indicate that the frame does not contain a virtual delimiter, the remaining first bit of the remaining segment headers (segments 2-7) may be used to contain error check code bits (indicated by Seq[1]-Seq[6]) that can be used for error checking of the frame payload data once the frame is received at the receivers of the switch fabric. If the error check code bits do not represent an expected sequence number, i.e. one or more of the bits does not hold an expected value, an error is indicated. Such an error could result from a misalignment of the segments with respect to each other, for example, as a result of skew.

Also illustrated in FIG. 6B, a second bit of the segment headers for each segment of the frame may be used to detect transmission errors. This discussion focuses on using a CRC. However, this is not intended to be limiting. Various forms of error detection can be used. For example, to minimize cost in terms of logic, a checksum can be used by computing the checksum and inserting the checksum into the frame. In order to provide increased effectiveness in error detection, a transmitter can compute a CRC for a frame and insert the CRC into the frame. The CRC can be computed for all information contained in the frame or for only a portion of the information contained in the frame. In one embodiment, the CRC is calculated for 25 of the 26 bytes of a frame. The 26$^{th}$ byte of the frame is used to store the value of the CRC once the CRC is calculated for the other 25 bytes.

When the frame is received by a receiver, the receiver can compute a CRC for the frame and compare the CRC computed by the receiver with the CRC transmitted with the frame. If the two CRCs do not match, the receiver can presume that there was an error transmitting the frame and the receiver can drop the frame or otherwise indicate a transmission error. Thus, transmission errors on serial links of the communication channel 305 are detected by transferring a single CRC bit of a segment header in each segment transferred across the communication channel 305. When considered in view of an entire frame, the CRC bits are sometimes collectively referred to herein as a CRC byte.

In a preferred embodiment, both the CRC byte and the virtual delimiter are added to certain frames. However, as will be appreciated by those of ordinary skill in the art upon viewing the present disclosure, principles of the present invention may be realized by forming frames with only a CRC byte or with only the virtual delimiter.

Figure 7:
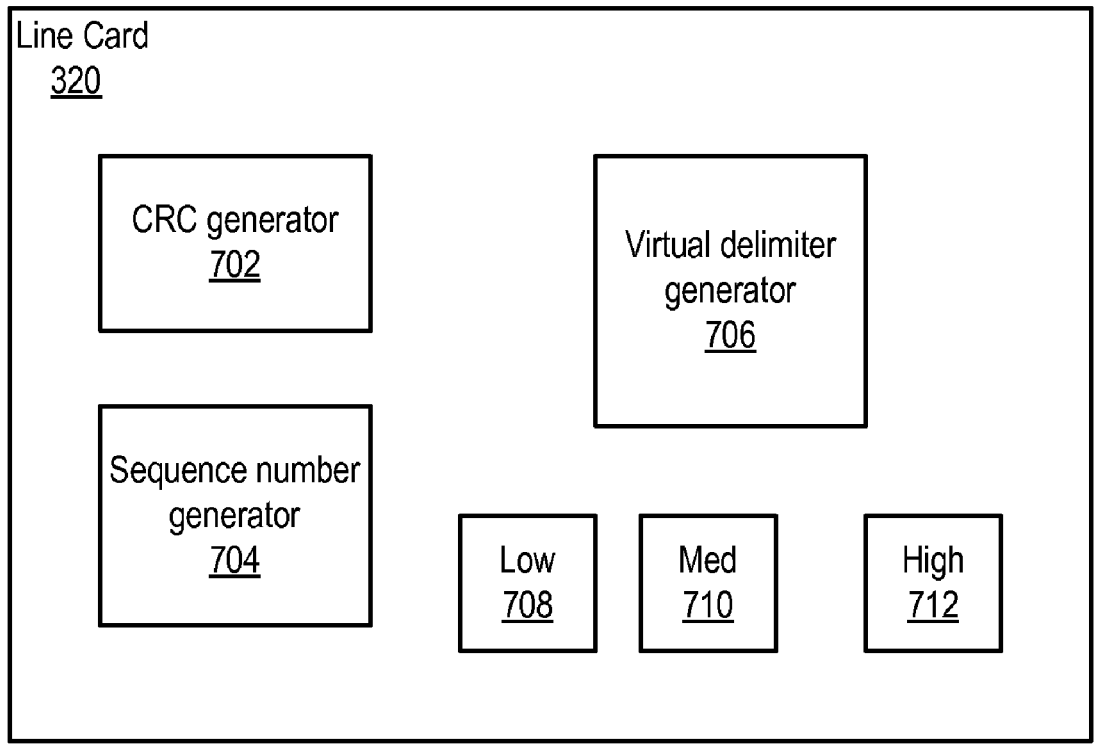
FIG. 7 illustrates relevant components of the line card in FIG. 3.

In the second stage 603 of FIG. 6A, in a preferred embodiment, a line card performs concatenations of packet byte slices and frame header to form the segments of frame 606. FIG. 7 is a block diagram illustrating certain but not other aspects of one embodiment of the line card 320 of FIG. 4. In FIG. 7, line card 320 is illustrated with a CRC generator 702 for generating the CRC and inserting the CRC bits into segments prior to transferring the segments across links. Also illustrated is a sequence number generator 704 that is used to generate sequence bits that are each placed as the first bit in a number of respective segment headers of a frame such that the respective segment header bits may serve in an error checking capacity for the frame.

A virtual delimiter generator 706 is illustrated for generating packet control information within select frames. The packet control information includes information such as packet boundary information that is identified by frame header bits PB[0]-PB[2] as described with relation to FIG. 6B. The virtual delimiter generator 706 also interacts with packet priority data queues such as low priority queue 708, medium priority queue 710, and high priority queue 712. In this manner, the virtual delimiter generator 706 is able to track packet priorities and generate delimiters for only the appropriately prioritized packets. For example, as illustrated in FIG. 5, packet 506 is a low priority (LP) packet. An LP packet is a packet that may have its transmission on the communication channel 305 interrupted, or stopped, by a higher priority packet taking over the communication channel 305. For example, LP packet 506 may be interrupted by high priority (HP) packet 508 because HP packet 508 has a higher priority than LP packet 506. In the illustrated embodiment, virtual delimiter generator 706 will not generate delimiters for packets from the low or medium priority queues 708 and 710 if packets arrive from the high priority queue 712. Likewise, virtual delimiter generator 706 will not generate a delimiter for a packet from the low priority queue 708, but give priority to packets from either the medium or high priority queues 710 and 712. Of course, line card 320 could be configured to operate with a greater or lesser number of priority queues.

Figure 8:
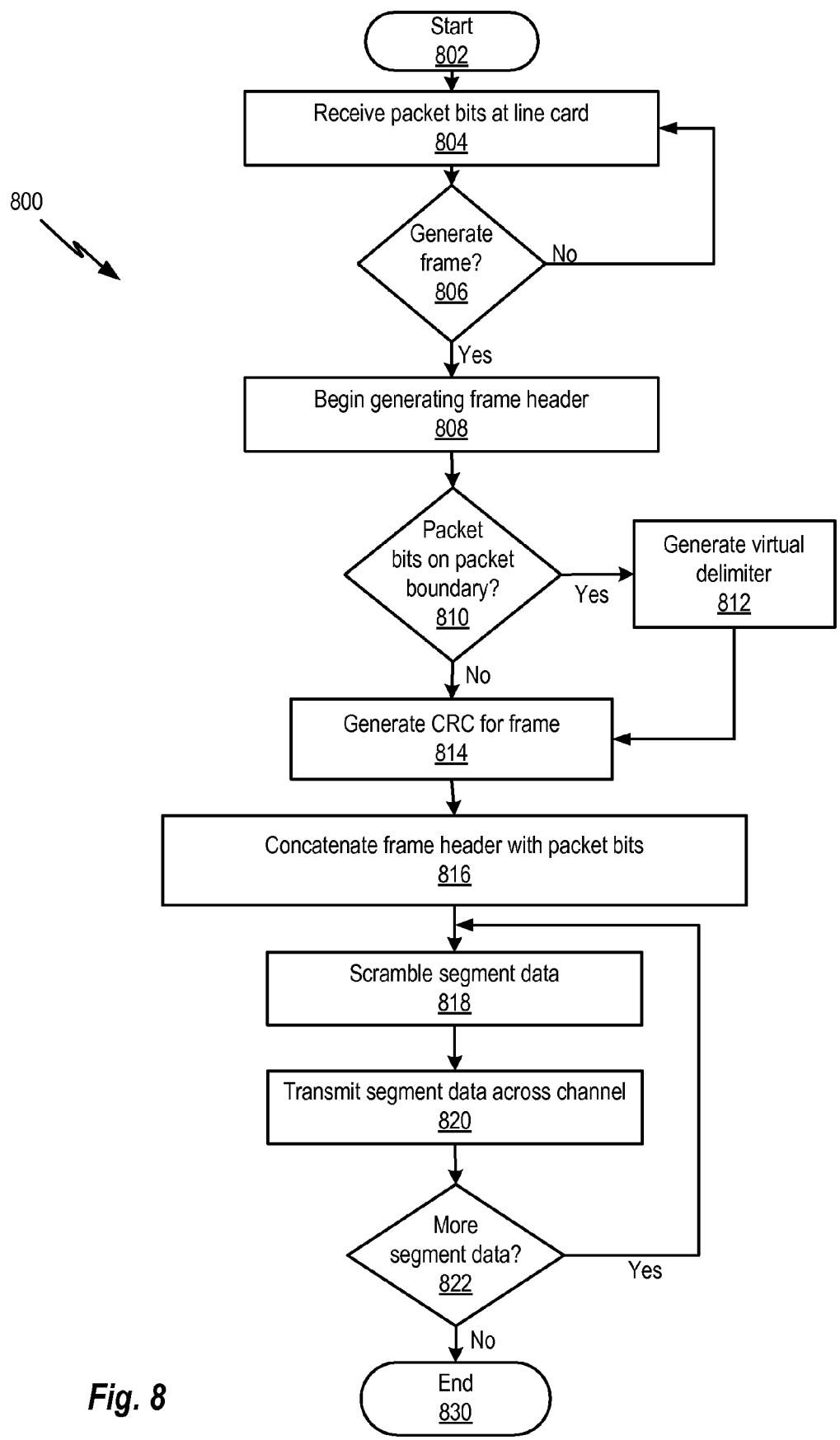
FIG. 8 is a flowchart depicting relevant aspects of bit transmission across a communication channel according to one embodiment.

FIG. 8 illustrates a flow diagram 800 which shows relevant operations performed by a line card, such as line card 320 of FIG. 3, in response to receiving a packet for transmission to switching fabric 310, also of FIG. 3. The process of FIG. 8 begins with a start operation 802. Next, process block 804 shows packet bits being received at a line card for transmission across a communication channel such as the communication channel 305 of FIG. 3, connected between the line card 320 and the switching fabric 310. In process block 806, a decision is made as to whether a frame can be generated from the packet bits that have been received at the line card 320. If a frame cannot be generated, then the process returns to process block 804 where more packet bits are received at the line card 320. Otherwise, as illustrated at process block 808, a generation of a frame header is begun. As described above, a frame header can include a number of different types of bits such as sequence bits for error checking capabilities, CRC bits for transmission error detection, and virtual delimiter bits to identify things such as a packet boundary.

Figure 9:
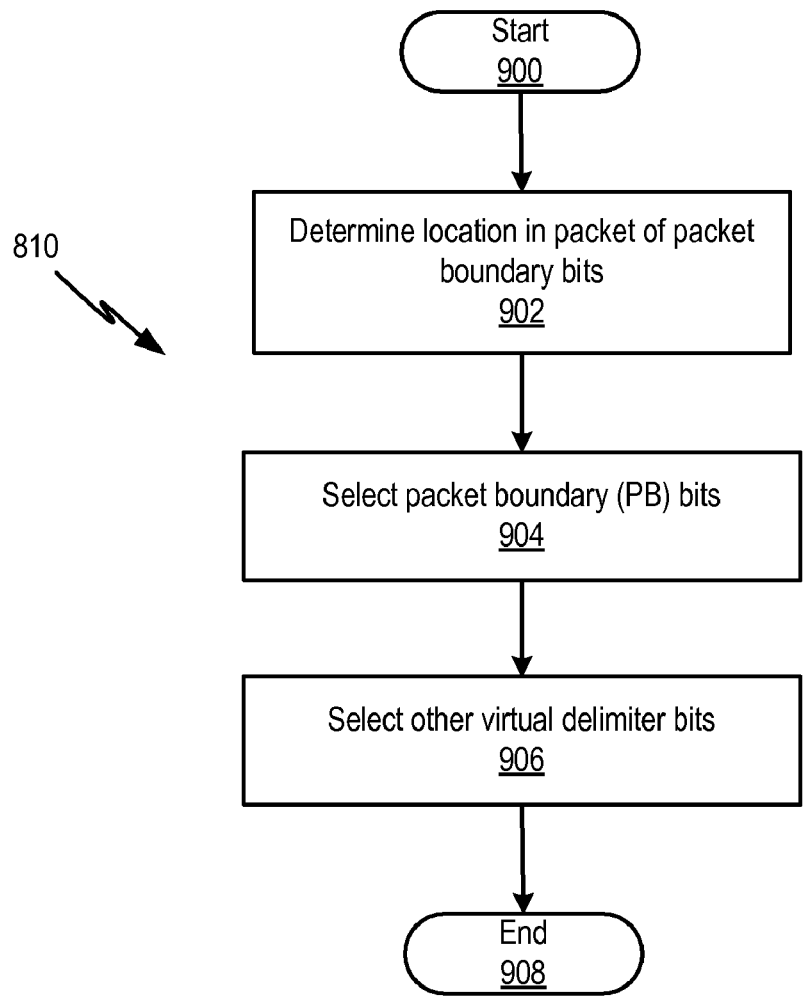
FIG. 9 is a flowchart depicting relevant aspects of generating a virtual delimiter according to one embodiment.

To generate a frame header as indicated at process block 808, decision block 810 first determines whether packet bits are on a packet boundary. If the packet bits are on a packet boundary, a virtual delimiter is generated at process block 812 that will become part of the frame header. As discussed above, this virtual delimiter is intended to indicate which slices of a packet are included in the frame, e.g., as illustrated by the virtual delimiter of FIGS. 4B and 4C or by the virtual delimiters listed in the table of FIG. 6C. FIG. 9 provides a more detailed description of generating the virtual delimiter according to the embodiment of FIG. 8.

Whether a virtual delimiter is to be generated or not, process block 814 of FIG. 8 illustrates generating a CRC for a frame that is to be transmitted across a communication channel such as the communication channel 305 of FIG. 4A.

Process block 816 shows concatenating a frame header with segment payloads of a frame. For each segment payload, the frame header includes a CRC bit and may include a virtual delimiter bit to form a segment in anticipation of transmitting a frame across the communication channel. Of course, for each link of the communication channel, respective segment payload bytes from each 64 bit slice of packet payload data are concatenated with the corresponding header bits. This concatenation of data bytes with a CRC bit, and possibly with a virtual delimiter bit, is what creates a segment for transmission across a link of the communication channel.

Prior to being transmitted by the transmitter across a link of the channel at process block 820, each segment passes through a 26-to-10 gearbox. The gearbox formats the segment so that a serdes (e.g., serdes 420 of FIG. 4A) can receive and process the segment. As input, the gearbox accepts a 26 bit wide segment of data. However, many serdes circuits are configured to accept only 10 bit wide portions of data as input. So, the 26 bit wide portion of data is reformatted into 10 bit wide portions of data and the 10 bit wide portions of data are passed to the serdes. The processing performed by the serdes includes serializing the segment for transmission across a serial link.

After being processed by the gearbox, process block 818 shows that the segment is scrambled by a scrambler (e.g., scrambler 410 of FIG. 4A). The operation of the scrambler is discussed in greater detail with reference to FIG. 11. Next, the process proceeds to process block 820. Process block 820 illustrates that the resulting scrambled segment data then passes to the serdes, and is transferred across the communication channel to the receiving serdes. At process block 822, the transmitter determines whether there is more data to be transmitted. If not, the process ends at operation 830. If there is more data to be transmitted, the process returns to operation 818. This cycle repeats until all of the frame data awaiting transmission is transmitted.

FIG. 9, which begins at a start operation 900, is a flow diagram showing more details regarding the virtual delimiter generation of process block 812 of FIG. 8. Process block 902 illustrates determining the location of packet boundary bits within the packet that is to be transmitted. For example, if the packet slices are the first three slices of a new packet, the PB bits of the virtual delimiter will be set to 011 as illustrated in FIG. 4B and as shown in case IV of the table of FIG. 6C. Process block 904 illustrates selecting the PB bits according to the location of the slices relative to the packet(s) being sliced. In one embodiment, this entails dividing 64 bits into 8 bytes, i.e., one byte per serial link of a communication channel. The 64 bits could be used to form eight bytes of a frame. Process block 906 shows determining the setting for other bits of the virtual delimiter such as the PS bit and Q bits as described above. The process of generating a virtual delimiter ends with an end operation 908.

Each of the three packet boundary bits could appear in different segment headers of a frame header to form a portion of the virtual delimiter for a frame. In one embodiment, if the bits of the virtual delimiter were set to 000, then the frame payload would hold the last 24 bytes of a packet. If the bits of the virtual delimiter were set to 011, then the frame payload would hold the first 24 bytes of a packet. Other bit settings could also be used to represent different byte configurations in a frame such as the last 16 bytes of a first packet and the first eight bytes of a second packet. Those of ordinary skill in the art will appreciate the numerous possibilities for the virtual delimiter when viewing the present disclosure.

Figure 10:
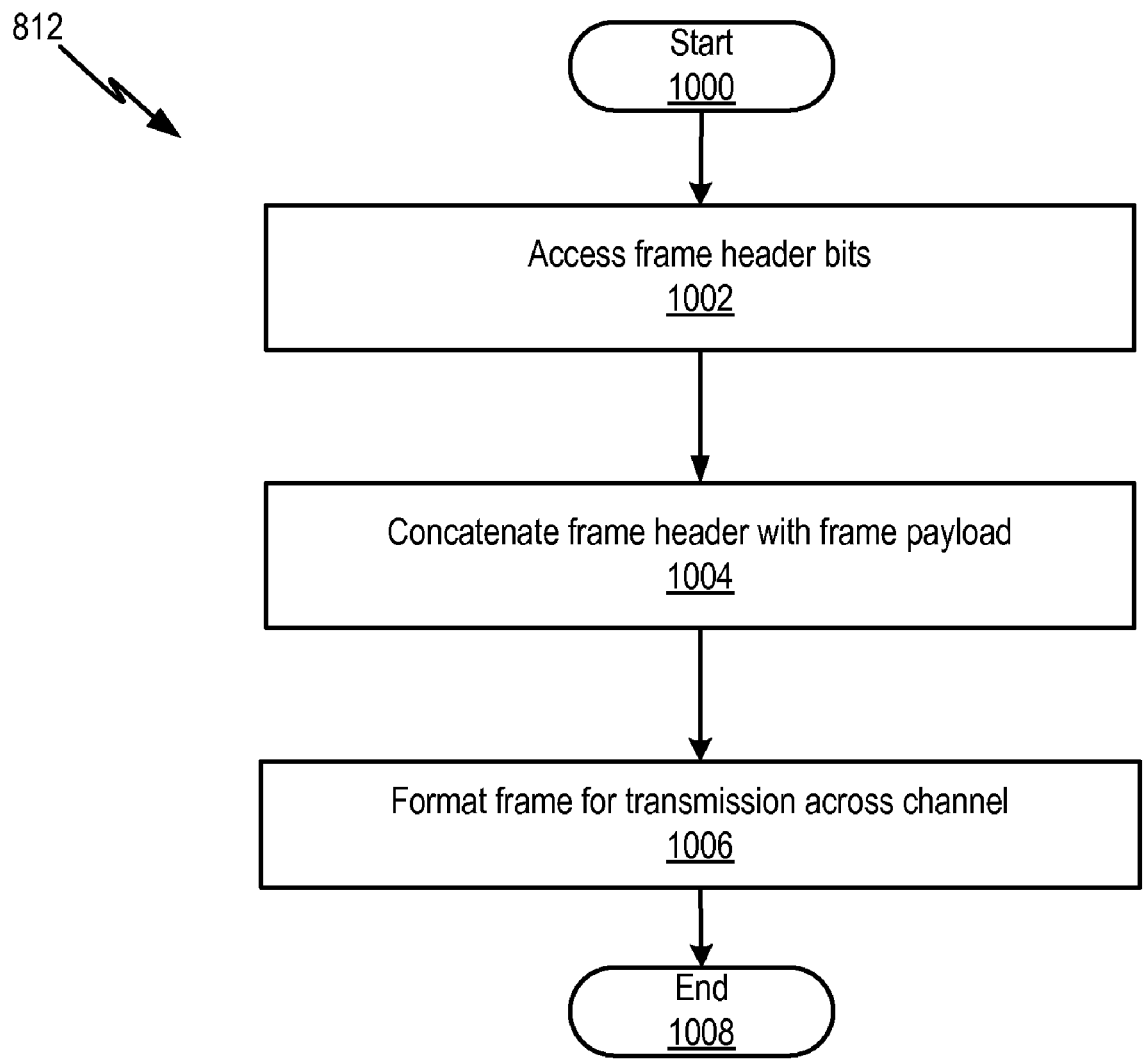
FIG. 10 is a flowchart depicting relevant aspects of bit concatenation according to one embodiment.

FIG. 10, which begins with a start operation 1000, illustrates one embodiment for concatenating bits to form a frame that is to be transmitted across a channel. FIG. 10 may be considered to be an expansion of process block 816 of FIG. 8. Process block 1002 of FIG. 10 illustrates accessing frame header bits that are to be concatenated with packet payload bytes that will be used to form a frame payload. The frame header bits are bits such as the virtual delimiter bits, CRC bits, and/or sequence bits that were generated and set as discussed with relation to FIGS. 8 and 9. Process block 1004 illustrates concatenating the frame header with the frame payload to form respective segments of a frame. Of note, the concatenation of a segment could include concatenating segment payload with only a single bit of a frame header such as a segment CRC bit or segment delimiter bit. The frame is then formatted for transmission across a channel as depicted in process block 1006. The process then proceeds to an end operation 1008. Once a frame is formatted for transmission across the channel, the frame is transmitted across the channel as shown in process block 814 of FIG. 8.

Figure 11:
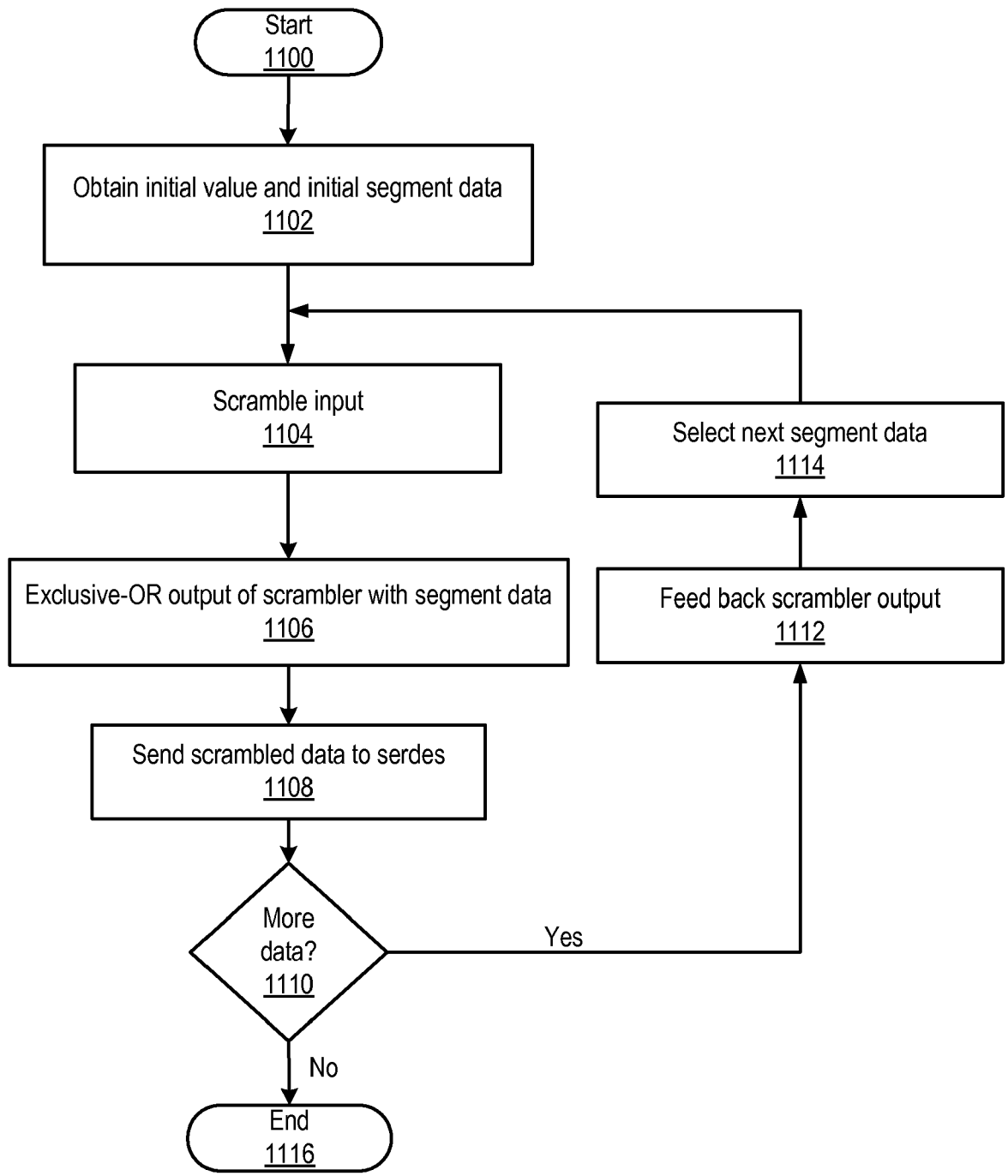
FIG. 11 is a flowchart depicting relevant aspects of scrambling the received bits according to one embodiment.

FIG. 11, which begins with a start operation 1100, illustrates one embodiment of scrambling the bits of a segment. At process block 1102, the scrambler obtains an initial value. In one embodiment, this value is a 10 bit number provided by a pseudorandom number generator (not shown). The scrambler is initialized with the initial value, i.e., the scrambler combines this initial value with the first in series of random or pseudo-random values produced by the scrambler. The scrambler produces these values according to an algorithm which defines the scrambler's operation. In one embodiment, the scrambler adds the input value with one of the values in the series produced by the scrambler. In other embodiments the scrambler may combine input values with values in the produced sequence using other operations. For example, multiplication could be used instead of addition. Process block 1104 depicts the scrambler scrambling input to produce a first 10 bit scrambled output. At process block 1106, the scrambler exclusive OR's this output with 10 bits of segment data output by the 26-to-10 gearbox, producing a first 10 bit portion of scrambled segment data. This scrambled segment data is passed to the serdes for transmission at process block 1108. At decision block 1110, the scrambler determines whether there is subsequent data to be scrambled. If so, the process feeds the scrambled output of the scrambler back into the scrambler (at process block 1112). The process then selects the next data to be scrambled (at process block 1114) and returns to process block 1104. At process block 1104, the scrambler scrambles the input (which was output from the scrambler in the previous iteration) to produce a subsequent 10 bit scrambled output. This subsequent scrambled output is then exclusive-OR'ed with the next 10 bits of segment data to produce scrambled segment data. This subsequent scrambled segment data passes to the serdes and is serialized and transmitted to the receiving serdes. This cycle can repeat as long as there is data to transmit. When no data remains to be scrambled, the process ends at process block 1116.

Figure 12:
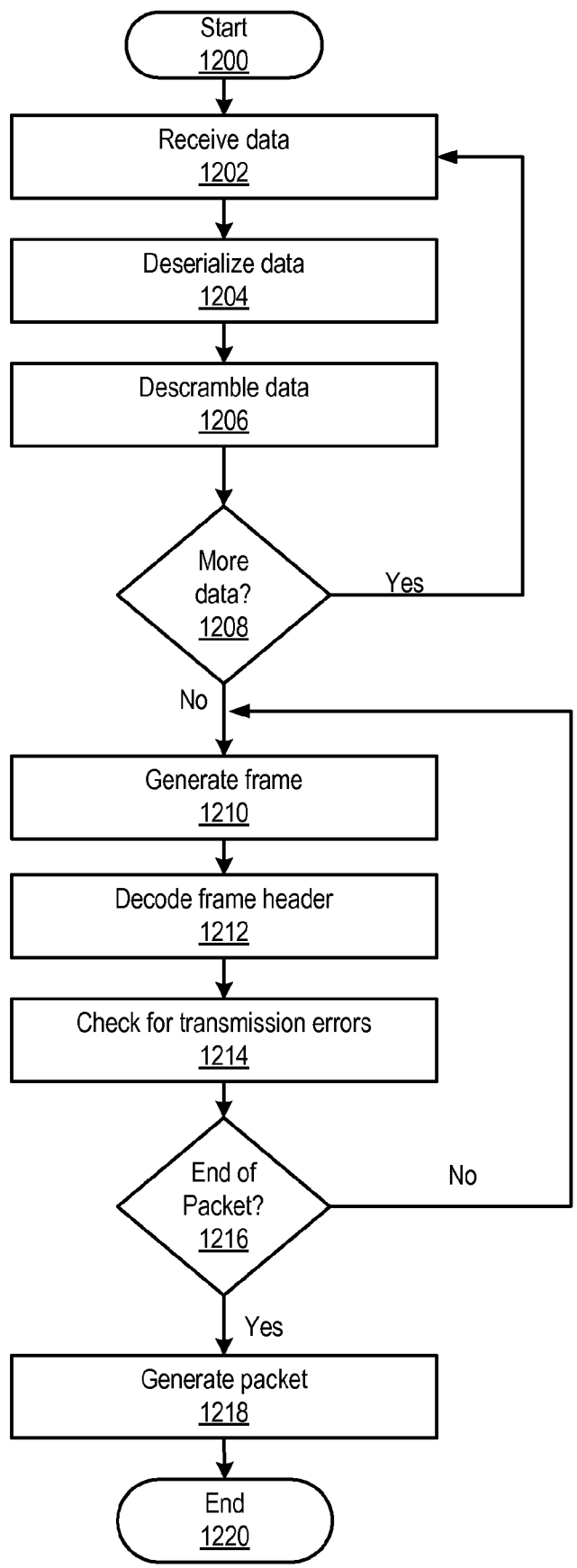
FIG. 12 is a flowchart depicting relevant aspects of receiving bits from a channel according to one embodiment.

FIG. 12 illustrates a flow diagram which shows relevant operations performed, for example, by a switching fabric, such as switching fabric 310 of FIG. 3, in response to receiving information from a line card, such as line card 320, also of FIG. 3. The process of FIG. 12 begins with a start operation 1200. Next, process block 1202 illustrates receiving data at a serdes, such as serdes 440 of FIG. 4A. At operation 1204, the serdes deserializes the received data. The serdes outputs a multi-bit parallel portion of data, for example, a 10 bit portion.

After the data is deserialized, process block 1206 illustrates that the data is descrambled. The descrambler operates similar to the scrambler discussed with reference to FIG. 11 and is discussed in greater detail with reference to FIG. 13. The data then passes to a 10-to-26 bit gearbox, which reformats the data to begin generating a 26 bit segment. The receiver determines if there is more data needed for the segment at process block 1208. If so, the process returns to block 1202, where more data is received.

Once all data for the segment has been received, descrambled, and deserialized, process block 1210 illustrates generating a frame using the received data. The frame generation process performed by the receiver corresponds to the process performed by the transmitter prior to transmission. That is, a frame header and frame payload information are concatenated to form a 26 bit segment. Typically, 8 segments are combined to form an encoded 26 byte frame. Once the receiver has generated the frame, the receiver decodes the frame, beginning with the header at process block 1212. The receiver can also perform error checking at process block 1214 to determine if the frame was transferred without error. The error checking can include determining if the frame contains a CRC. If so, the receiver can compute a CRC for the frame, extract the CRC in the frame, and compare the two values. The receiver uses an identical algorithm to compute the CRC to the algorithm used by the transmitter to compute the CRC embedded in the frame. If the values match, the frame was transmitted without transmission errors. If the two values do not match, there was an error and the frame can be discarded or the error can be otherwise indicated, e.g., by flagging the frame.

The receiver can also use the frame payload data to form one or more packets. If the header contains a virtual delimiter, the receiver determines, based on the values of the virtual delimiter bits, whether the frame payload data belongs to one or more packets and whether the frame payload data includes the final data of a packet. If the frame includes the final data of a packet, the receiver generates a packet using the received data at process block 1218. Otherwise, the receiver waits for more frames of data before generating the packet. Once a packet is generated, the packet can be sent on to the packet's destination. Process block 1220 illustrates the process end.

Figure 13:
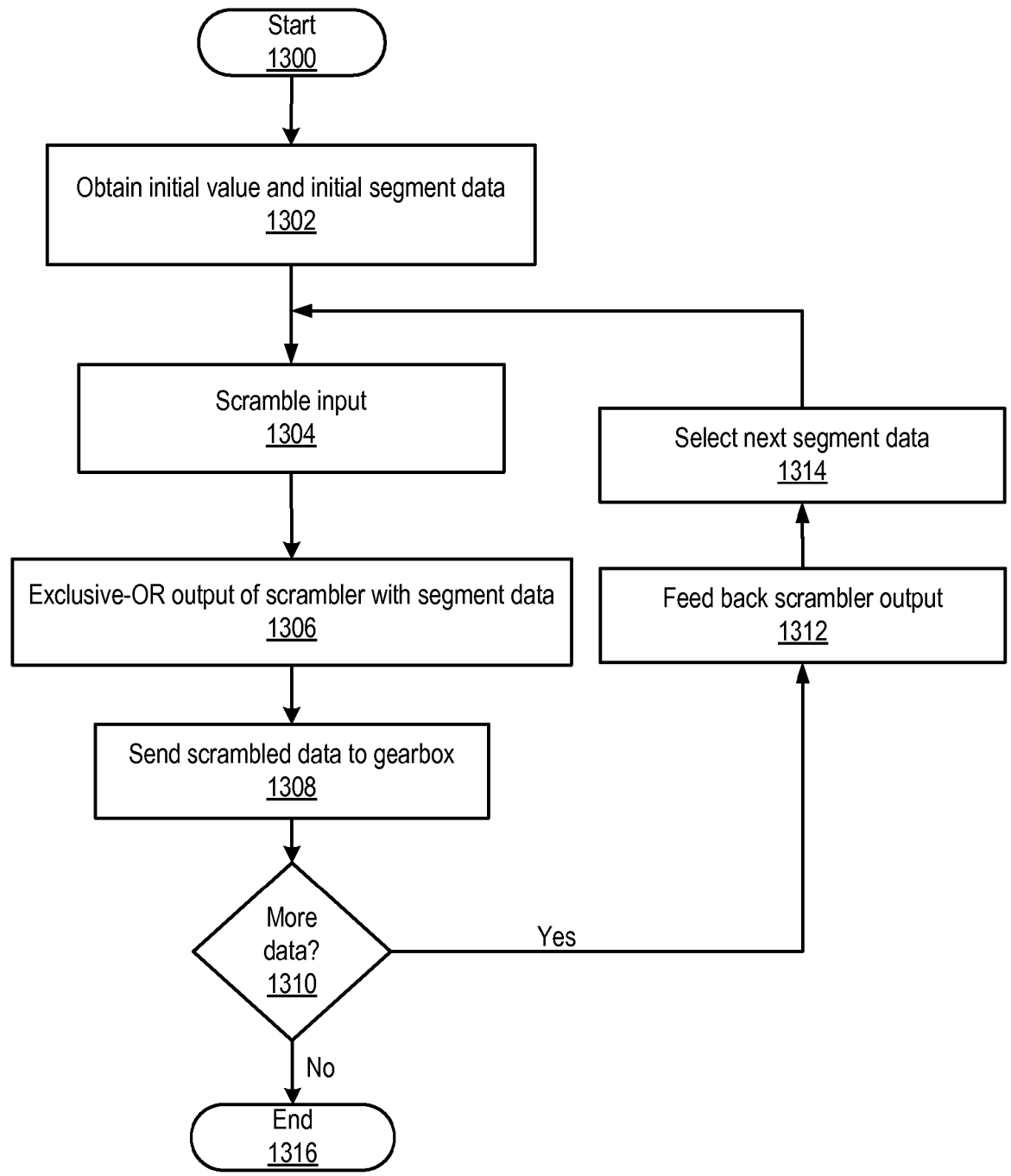
FIG. 13 is a flowchart depicting relevant aspects of descrambling the received bits according to one embodiment.

FIG. 13 expands on the descramble operation 1206 of FIG. 12. The process begins with a start operation 1300 and then proceeds to process block 1302, where the descrambler obtains a portion of data and an initial value. The data is data that has been received from the line card and deserialized. The initial value is the same initial value used to initialize the scrambler on the line card. The descrambler is initialized using this initial value in the same way as the scrambler was initialized. Process block 1304 shows that the initial value is input to the descrambler and scrambled, producing a scrambled output. This output is identical to the first scrambled output produced by the scrambler on the transmit side, since the scrambler and descrambler are initialized with the same initial value and both use the same algorithm to produce identical scrambled values.

At process block 1306, the scrambled output is exclusive OR-ed with the received data. This exclusive-OR operation produces the data that was sent to the scrambler on the line card, since exlcusive-OR'ing data twice with the same value produces the original data. Process block 1308 shows that this data is sent to a 10-to-26 gearbox to be used in generating a frame. At process block 1310, the scrambler determines whether there is subsequent data to descramble. If so, the first output value of the descrambler is fed back into the descrambler at process block 1312. Process block 1314 shows selecting the next segment data to descramble, and then the process returns to process block 1304. At process block 1304, the descrambler produces a subsequent scrambled output, which can be exclusive OR-ed with the subsequent portion of received segment data. This cycle can repeat as long as there is received data. When no data remains to be descrambled, the process ends at process block 1316.

Figure 14:
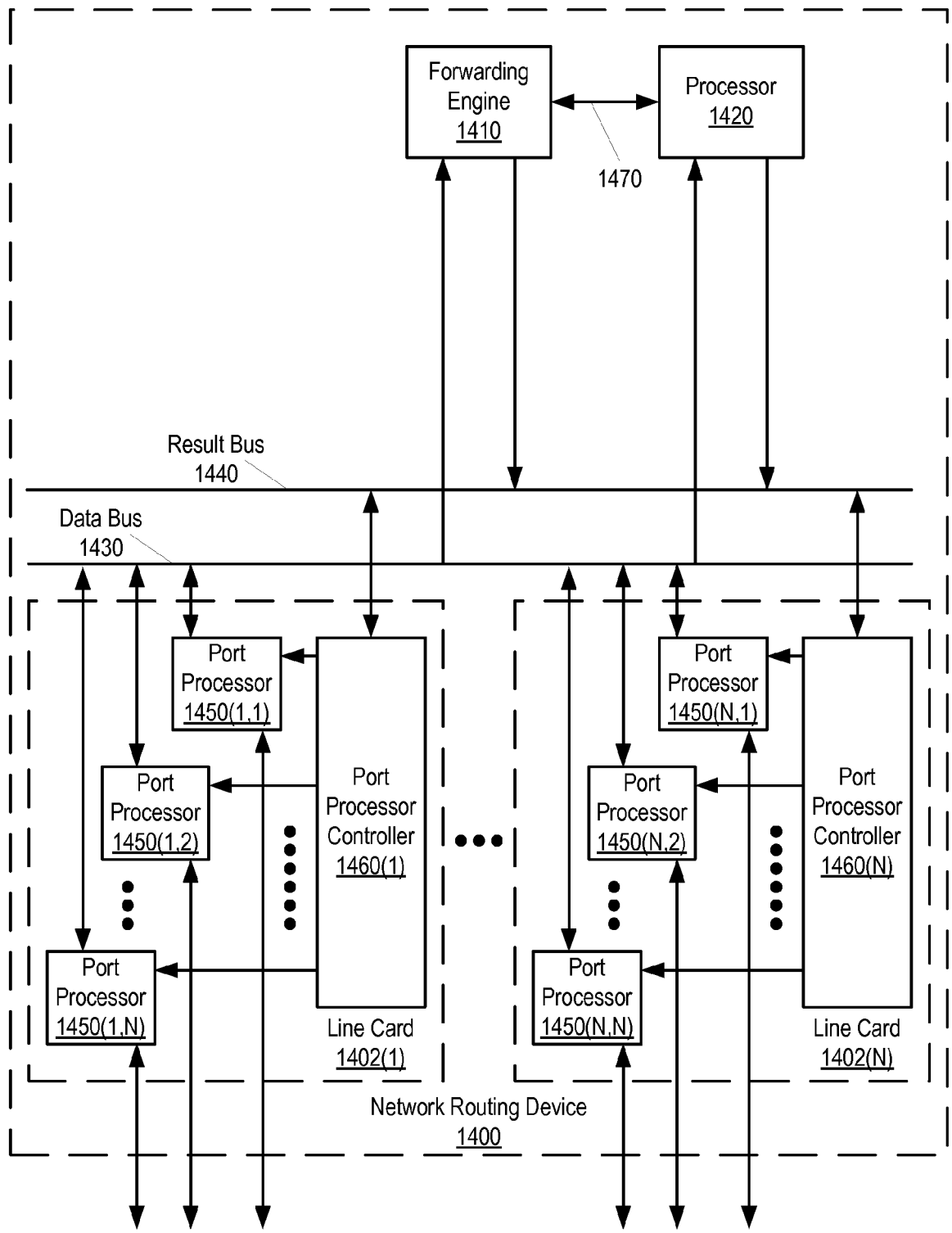
FIG. 14 illustrates relevant components of an example network routing device.

FIG. 14 is a block diagram showing an example of relevant components of a network routing device 1400 appropriate for implementing embodiments of the present invention in which the present invention may be used. In this depiction, network routing device 1400 includes a number of line cards (line cards 1402(1)-(N)) that are communicatively coupled to a forwarding engine 1410 and a processor 1420 via a data bus 1430 and a result bus 1440. Line cards 1402(1)-(N) include a number of port processors 1450(1,1)-(N,N) which are controlled by port processor controllers 1460(1)-(N). It will also be noted that forwarding engine 1410 and processor 1420 are not only coupled to one another via data bus 1430 and result bus 1440, but are also communicatively coupled to one another by a communications link 1470.

When a packet is received, the packet is identified and analyzed by a network routing device such as network routing device 1400 in the following manner, according to embodiments of the present invention. Upon receipt, a packet (or some or all of its control information) is sent from the one of port processors 1450(1,1)-(N,N) at which the packet was received to one or more of those devices coupled to data bus 1430 (e.g., others of port processors 1450(1,1)-(N,N), forwarding engine 1410 and/or processor 1420). Handling of the packet can be determined, for example, by forwarding engine 1410. For example, forwarding engine 1410 may determine that the packet should be forwarded to one or more of port processors 1450(1,1)-(N,N). This can be accomplished by indicating to corresponding one(s) of port processor controllers 1460(1)-(N) that the copy of the packet held in the given one(s) of port processors 1450(1,1)-(N,N) should be forwarded to the appropriate one of port processors 1450(1,1)-(N,N).

In the foregoing process, network security information can be included in a frame sourced by network routing device 1400 in a number of ways. For example, forwarding engine 1410 can be used to detect the need for the inclusion of network security information in the packet, and processor 1420 can be called into service to provide the requisite network security information. This network security information can be included in the packet during the transfer of the packet's contents from one of port processors 1450(1,1)-(N,N) to another of port processors 1450(1,1)-(N,N), by processor 1420 providing the requisite information directly, or via forwarding engine 1410, for example. The assembled packet at the receiving one of port processors 1450(1,1)-(N,N) can thus be made to contain the requisite network security information.

In addition, or alternatively, once a packet has been identified for processing according to the present invention, forwarding engine 1410, processor 1420 or the like can be used to process the packet in some manner or add packet security information, in order to secure the packet. On a node sourcing such a packet, this processing can include, for example, encryption of some or all of the packet's information, the addition of a digital signature or some other information or processing capable of securing the packet. On a node receiving such a processed packet, the corresponding process is performed to recover or validate the packet's information that has been thusly protected.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   receiving bits of a data packet;
   generating an encoded frame, wherein
      the encoded frame comprises a frame payload field and a frame header field,
      the encoded frame comprises the received bits,
      the encoded frame comprises at least one of an error check code or a virtual delimiter, and
      the encoded frame comprises less than the whole data packet;
   calculating a cyclic redundancy check (CRC) for the encoded frame;
   inserting the CRC into the encoded frame, wherein the CRC is separate from the error check code;
   dividing the encoded frame into a plurality of segments, wherein
      each segment of the plurality of segments comprises respective frame header information and respective frame payload information; and
   transmitting the plurality of segments over a respective plurality of serial communication links.

2. The method of claim 1 wherein
   the first segment includes one bit of the CRC.

3. The method of claim 1 further comprising:
   generating the virtual delimiter and inserting the virtual delimiter into the encoded frame before the encoded frame is divided.

4. The method of claim 3, wherein
   the first segment includes one bit of the virtual delimiter.

5. The method of claim 1 further comprising:
   recoverably scrambling the encoded frame.

6. The method of claim 1, wherein
the CRC is calculated for a portion of the encoded frame and the portion is less than the whole encoded frame.

7. The method of claim 1, further comprising:
receiving a portion of the encoded frame;
descrambling the portion; and
extracting a CRC bit included in the portion.

8. An apparatus comprising:
a first circuit configured to generate an encoded frame in response to receiving bits of a data packet, wherein
the encoded frame comprises a frame payload field and a frame header field,
the encoded frame comprises the received bits,
the encoded frame comprises at least one of an error check code or a virtual delimiter, and
the encoded frame comprises less than the whole data packet,
calculate a cyclic redundancy check (CRC) for the encoded frame,
insert the CRC into the encoded frame, wherein the CRC is separate from the error check code,
divide the encoded frame into a plurality of segments, wherein
each segment of the plurality of segments comprises respective frame header information and respective frame payload information, and transmit the plurality of segments over a respective plurality of serial communication links.

9. The apparatus of claim 8 wherein
the first segment includes one bit of the CRC.

10. The apparatus of claim 8 further comprising:
a second circuit configured to
generate the virtual delimiter, and
insert the virtual delimiter into the encoded frame before the encoded frame is divided.

11. The apparatus of claim 10, wherein
the first segment includes one bit of the virtual delimiter.

12. The apparatus of claim 8 further comprising:
a second circuit configured to recoverably scramble the encoded frame.

13. The apparatus of claim 8, wherein
the CRC is calculated for a portion of the encoded frame and the portion is less than the whole encoded frame.

14. The apparatus of claim 8, further comprising:
a second circuit configured to
receive a portion of the encoded frame,
descramble the portion, and
extract a CRC bit included in the portion.

15. An apparatus comprising:
a first means for
generating an encoded frame in response to receiving bits of a data packet, wherein
the encoded frame comprises a frame payload field and a frame header field,
the encoded frame comprises the received bits,
the encoded frame comprises at least one of an error check code or a virtual delimiter, and
the encoded frame comprises less than the whole data packet,
calculating a cyclic redundancy check (CRC) for the encoded frame, and
inserting the CRC into the encoded frame, wherein the CRC is separate from the error check code,
dividing the encoded frame into a plurality of segments, wherein
each segment of the plurality of segments comprises respective frame header information and respective frame payload information, and
transmitting the plurality of segments over a respective plurality of serial communication links.

16. The apparatus of claim 15, further comprising:
a second means for
receiving a portion of the encoded frame,
descrambling the portion, and
extracting a CRC bit included in the portion.

* * * * *